US006413381B1

(12) United States Patent
Lee et al.

(10) Patent No.: US 6,413,381 B1
(45) Date of Patent: *Jul. 2, 2002

(54) HORIZONTAL SPUTTERING SYSTEM

(75) Inventors: Ken Lee, Mountain View; Ke Ling Lee, Cupertino; Mingwei Jiang, Sunnyvale; Robert M. Martinson, San Mateo, all of CA (US)

(73) Assignee: Steag HamaTech AG, Sternenfels (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/547,986

(22) Filed: Apr. 12, 2000

(51) Int. Cl.[7] .............................................. C23C 14/34

(52) U.S. Cl. ............................ 204/192.12; 204/192.1; 204/298.15; 204/298.23; 204/298.25; 204/298.11; 204/298.28

(58) Field of Search ..................... 204/192.1, 298.15, 204/298.23, 298.25, 298.11, 298.28, 192.12

(56) References Cited

U.S. PATENT DOCUMENTS

| 3,874,525 A | 4/1975 | Hassan et al. ............. 214/17 B |
| 3,915,117 A | 10/1975 | Schertler ...................... 118/49 |
| 4,355,937 A | 10/1982 | Mack et al. ................. 414/217 |
| 4,523,985 A | 6/1985 | Dimock ....................... 204/298 |
| 4,534,314 A | 8/1985 | Ackley ........................ 118/733 |
| 4,548,699 A | 10/1985 | Hutchinson et al. ......... 204/298 |
| 4,588,343 A | 5/1986 | Garrett ........................ 414/221 |
| 4,670,126 A | 6/1987 | Messer et al. ............... 204/298 |
| 4,685,852 A | 8/1987 | Rubin et al. ................. 414/404 |
| 4,699,554 A | 10/1987 | Kawashima et al. ......... 414/217 |
| 4,701,251 A | 10/1987 | Beardow ..................... 204/298 |
| 4,733,631 A | 3/1988 | Boyarsky et al. ............ 118/719 |

(List continued on next page.)

FOREIGN PATENT DOCUMENTS

| EP | 0 443 049 | 8/1991 | ............ C23C/14/34 |
| GB | 2-173 217 | 10/1986 | ............ C23C/14/04 |
| GB | 2 191 787 | 12/1987 | ............ C23C/14/04 |
| GB | 2 271 332 | 4/1994 | ............ B65G/29/00 |
| GB | 2 271 542 | 4/1994 | ............ B65G/29/00 |
| GB | 2 296 698 | 7/1996 | ............ B65G/29/00 |
| GB | 2 298 655 | 9/1996 | ............ C23C/14/34 |
| GB | 2 318 589 | 4/1998 | ............ C23C/14/50 |
| JP | 59157281 | 9/1984 | ............ C23C/15/00 |
| JP | 2-85366 | 3/1990 | ............ C23C/14/50 |
| JP | 3-168948 | 7/1991 | ............ C23C/14/04 |
| JP | 04002766 | 1/1992 | ............ C23C/14/22 |
| JP | 10046339 | 2/1998 | ............ C23C/14/50 |
| JP | 2000-17422 | 1/2000 | ............ C23C/14/04 |

Primary Examiner—Steven H. VerSteeg
(74) Attorney, Agent, or Firm—Skjerven Morrill MacPherson LLP; James E. Parsons

(57) ABSTRACT

A plasma sputtering system that may be used to deposit a film on a substrate such as an optical disk is disclosed. In one embodiment, the sputtering system includes a main vacuum chamber. A plurality of sputtering chambers and a load lock chamber are connected to the main vacuum chamber. An assembly of a horizontal unprocessed substrate, an inner mask, and an outer mask are pressed onto a substrate transport tray that is positioned in the load lock. The tray supports the substrate and the masks throughout the processing of the substrate. A vertical lift lowers the tray from the load lock onto a carousel. The carousel transports the tray, substrate and masks to the sputtering chambers and then back to the load lock for unloading. Other lifts raise the tray, processed substrate, and masks from the carousel to the sputtering chambers. The tray is selectively pressed against the lower access aperture of the load lock and sputtering chambers so as to isolated them from the main chamber. After processing is complete, the lift pedestal at the load lock raises the tray and the substrate and masks thereon from the carousel to the load lock, whereupon the substrate and masks are removed from the sputtering system.

52 Claims, 6 Drawing Sheets

U.S. PATENT DOCUMENTS

| | | | |
|---|---|---|---|
| 4,756,815 A | 7/1988 | Turner et al. | 204/298 |
| 4,820,106 A | 4/1989 | Walde et al. | 414/217 |
| 4,869,801 A | 9/1989 | Helms et al. | 204/298 |
| 4,886,592 A | 12/1989 | Anderle et al. | 204/298 |
| 4,938,858 A | 7/1990 | Zejda | 204/298.25 |
| 4,943,363 A | 7/1990 | Zejda et al. | 204/298.15 |
| 5,112,469 A | 5/1992 | Kempf et al. | 204/298.25 |
| 5,240,172 A | 8/1993 | Steinke et al. | 228/262.61 |
| 5,259,942 A | 11/1993 | Kempf | 204/298.25 |
| 5,354,380 A | 10/1994 | Zejda | 118/719 |
| 5,407,314 A | 4/1995 | Kempf | 414/217 |
| 5,451,130 A | 9/1995 | Kempf | 414/27 |
| 5,480,530 A | 1/1996 | Zejda | 204/298.11 |
| 5,612,068 A | 3/1997 | Kempf et al. | 425/574 |
| 5,669,652 A | 9/1997 | Reising et al. | 294/88 |
| 5,674,368 A | 10/1997 | Hashimoto et al. | 204/298.25 |
| 5,709,785 A * | 1/1998 | LeBlanc, III et al. | 204/298.25 |
| 5,791,851 A | 8/1998 | Kempf et al. | 414/217 |
| 5,800,687 A | 9/1998 | Kempf | 204/298.11 |
| 5,803,521 A | 9/1998 | Zejda et al. | 294/97 |
| 5,822,842 A | 10/1998 | Zejda | 29/450 |
| 5,863,399 A | 1/1999 | Sichmann | 204/298.19 |
| 5,876,082 A | 3/1999 | Kempf et al. | 294/95 |
| 5,879,121 A | 3/1999 | Kempf | 414/226 |
| 5,913,653 A | 6/1999 | Kempf | 414/226 |
| 6,264,804 B1 * | 7/2001 | Lee et al. | 204/192.12 |

* cited by examiner

HORIZONTAL SPUTTERING SYSTEM

BACKGROUND OF THE INVENTION

A conventional optical disk includes a plastic base upon which layers of various materials, such as metals, alloys, or dielectrics, are applied. One method of applying the layers of materials is to use a sputter deposition process.

A conventional sputter deposition process is performed using a plasma formed in a sputtering chamber of a sputtering system. The plasma is generated by applying electric power to a low pressure gas in the vacuum chamber. Ions originating within the plasma bombard a target that is formed of a material that is to be deposited on the optical disk. The bombarding ions eject material from the target. The ejected material deposits in a layer on the optical disk.

SUMMARY OF THE INVENTION

The present invention includes a sputtering system and methods that may be used to deposit a film on a substrate. The substrate may be an optical disk having a central aperture. The film deposited thereon may include a metal, an alloy, or an insulator, among other possibilities.

In one embodiment, the sputtering system includes a main vacuum chamber. A plurality of sputtering chambers and a load lock are connected to the main vacuum chamber. The sputtering system also includes a plurality of substrate transfer trays, each of which carries an assembly of a substrate, an inner mask, and an outer mask.

A method of using the sputtering system includes loading an unprocessed substrate and its accompanying inner and outer masks onto a transfer tray that is positioned in the load lock. The transfer tray receives, supports, and centers the substrate and masks, while at the same time sealing an access aperture between the load lock and the main vacuum chamber. The transfer tray, substrate and inner and outer masks are subsequently lowered by a lift pedestal onto a carousel in the main vacuum chamber. The carousel indexes the tray (and the substrate and masks supported thereon) through each of the sputtering stations. A lift pedestal beneath the respective sputtering chamber lifts the tray from the carousel and positions the tray so that the substrate thereon can be sputter coated. Meanwhile, the lift pedestal holds the tray over the access opening of the sputtering chamber so as to isolate the sputtering chamber from the main vacuum chamber. Each lift pedestal is supported on a gimbal to correct for any misalignment and lack of parallelism between the tray/pedestal and the surfaces around the access opening. After sputtering, the lift pedestal returns the tray to the carousel. Ultimately, the carousel returns the tray to the load lock so that the processed substrate and its accompanying inner and outer masks may be removed from the sputtering system. Whereupon, the cycle repeats.

The sputtering system of the present invention has numerous useful features. For example, the exemplary substrate transport tray: (1) holds the substrate during processing without touching areas that are sensitive to particles or scratches; (2) supports the substrate on a plurality of projections that are located so that the substrate can be lifted from the tray easily; (3) provides a thermal path for heat generated by the sputtering process to be removed from the substrate and masks; (4) provides centering for the outer mask; (5) provides a means of centering the substrate and inner mask relative to the outer mask; and (6) selectively seals the access opening of each of the sputtering chambers and the load lock chamber without requiring that the carousel itself be lifted. Using the tray to isolate the sputtering chambers and load lock from each other and from the main vacuum chamber allows separate processes to be performed simultaneously under different process conditions (e.g., different pressures), prevents cross-contamination of the processes, and allows the sputtering chambers and load lock to be separately vented to atmosphere.

The exemplary carousel also provides many useful features. For example, the carousel is relatively lightweight for easy rotation, yet holds a plurality of substrate transfer trays. Moreover, the engagement between the trays and the edges of the apertures of the carousel centers the trays relative to the carousel, allows the carousel to rotate at relatively high acceleration and velocity without any slippage of the trays, and allows the trays to be easily placed on or removed from the carousel.

The exemplary lift pedestals center the substrate transfer trays relative to the access aperture of the respective sputtering chamber and the load lock. The metal to metal connections between the lift pedestal and the tray also provides a thermal path for removing heat from the tray.

The exemplary load lock allows the substrate to be horizontally loaded into or unloaded from the sputtering system.

These and other features and advantages of the present invention will be better understood upon consideration of the drawings and the detailed description given below.

DETAILED DESCRIPTION OF THE EXEMPLARY EMBODIMENTS

The present application is related to another, commonly assigned patent application entitled "A System and Method for Handling and Masking a Substrate in a Sputter Deposition System," which was filed in the United States Patent and Trademark Office on the same day as the present application, has been assigned Ser. No. 09/547,522, is now U.S. Pat. No. 6,264,804 and is incorporated herein by reference in its entirety.

Figure 1:
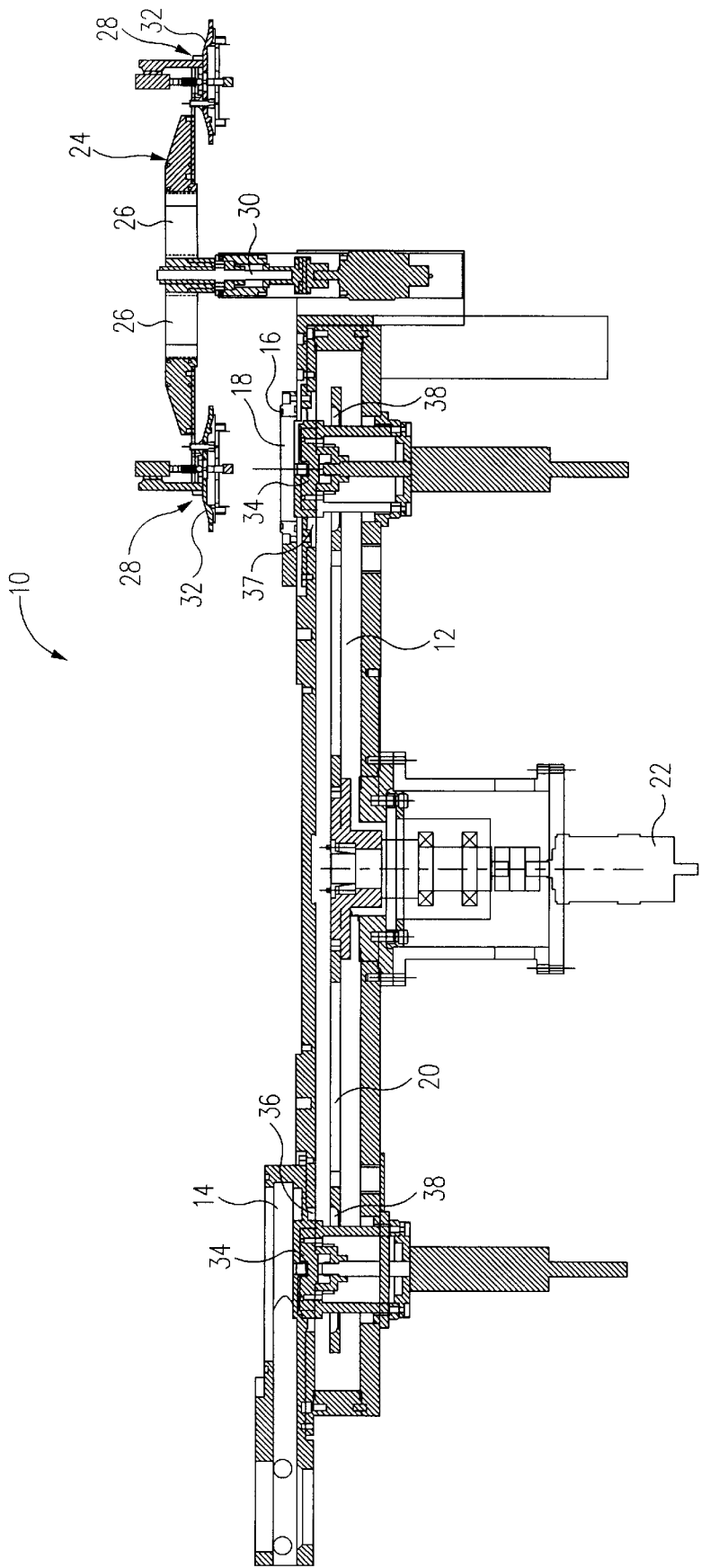
FIG. 1 is a cross-sectional side view of a sputtering system.
Figure 2:
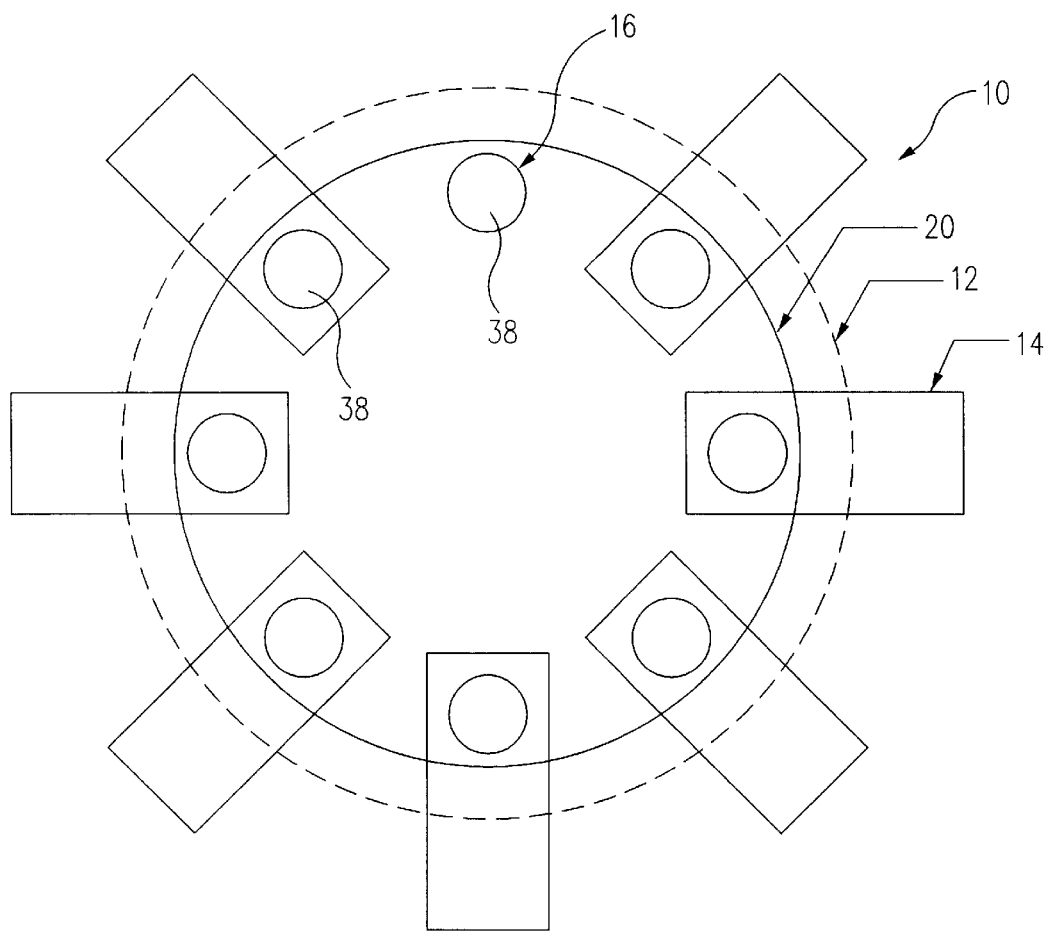
FIG. 2 is a top plan view of the sputtering system of FIG. 1.

FIGS. 1 and 2 provide cross-sectional and top plan views, respectively, of an embodiment of a horizontal sputtering system 10 within the present invention. Substrates are horizontally disposed during loading, processing, and unloading. A substrate handling system 24 is mounted on sputtering system 10 for loading and unloading the substrates. Sputtering system 10 includes a main vacuum chamber 12 and seven sputtering chambers 14, sometimes called process modules, that are interconnected with main vacuum chamber 12. The number of sputtering chambers 14 can vary.

Each sputtering chamber 14 includes a rotating magnetron cathode. Examples of magnetron cathodes that may be used are set forth in a co-pending U.S. Patent entitled "Magnetic Array for Sputtering System" (Ser. No. 09/499,092 pending), pending which was filed on Feb. 4, 2000 and is incorporated herein by reference.

Sputtering system 10 also includes a load lock chamber 16 through which an unprocessed substrate, an inner mask, and an outer mask are loaded into sputtering system 10 for sputtering, and through which a processed substrate and its accompanying inner and outer masks are removed after sputtering. Load lock 16 has an upper access aperture 18 through which substrate handling system 24 inserts and removes the substrates and their accompanying inner and outer masks. The inner mask masks a central portion of the substrate during sputtering. The outer mask masks a narrow circumferential portion of the substrate during sputtering.

Substrate handling system 24 includes a plurality of arms 26 mounted on a rotatable shaft 30. At the end of each arm 26 is an end effector 28. Each end effector 28 includes an inner mask gripper for gripping an inner mask, an outer mask gripper for gripping an outer mask, and a lid 32 for sealing aperture 18 of load lock 16 after end effector 28 is positioned therein.

End effector 28 is loaded with an unprocessed substrate at an external substrate change station. The unprocessed substrate is inserted onto the shaft of the inner mask and within the hollow body of the outer mask that are being gripped by end effector 28. Subsequently, substrate handling system 24 rotates and inserts the unprocessed substrate and its accompanying inner and outer masks through aperture 18 of load lock 16 and presses them onto a substrate transport tray 46 (FIG. 3) that is positioned within load lock 16, so that the disk is horizontally disposed on the tray. Meanwhile, lid 32 of end effector 28 covers aperture 18 so that load lock 16 can be evacuated to the pressure of main vacuum chamber 12. A lift pedestal 34 lowers transport tray 46 so that tray 46 comes to rest on a carousel 20 of sputtering system 10. Carousel 20 then indexes.

Subsequently, the same end effector 28 captures a processed substrate, inner mask, and outer mask that are brought to load lock 16 on another substrate transport tray by carousel 20 and lift pedestal 34. The end effector 28 grips the inner mask and the outer mask, and thereby captures the processed substrate. Load lock 16 is vented to atmosphere, after which substrate handling system 24 moves the processed substrate and its accompanying inner and outer masks to the external substrate change station. At the external substrate change station, the processed substrate is removed from end effector 28, and an unprocessed substrate is mounted on the inner mask and within the outer mask being gripped by end effector 28. The cycle subsequently repeats.

Sputtering system 10 includes eight, vertically moveable lift pedestals 34. One lift pedestal 34 is positioned below and aligned with a lower access aperture 36 of each sputtering chamber 14. Another lift pedestal 34 is positioned below and aligned with a lower access aperture 37 of load lock 16. The access apertures 36, 37 are respectively between main vacuum chamber 12 and each sputtering chamber 14 or load lock 16.

FIG. 1 shows two lift pedestals 34, one of which is in an elevated position at a sputtering chamber 14 and the other of which is in a similar elevated position at load lock 16. In the elevated position, lift pedestals 34 hold a respective substrate transport tray over the access aperture 36, 37 of the sputtering chamber 14 or load lock 16. The tray seals the access aperture 36, 37, and thereby isolates the sputtering chamber 14 or load lock 16 from main vacuum chamber 12 and the other sputtering chambers 14. A bellows may be used to enable the vertical motion of lift pedestal 34.

Carousel 20 is a rotary table that is located inside main vacuum chamber 12. A motor 22 rotates carousel 20. Carousel 20 has eight apertures 38 extending through it. The number of apertures corresponds to the load lock and the number of sputtering chambers, which can vary. Carousel 20 indexes a substrate transport tray (upon which a substrate and its accompanying inner and outer masks are supported) from load lock 16 to each sputtering station 14 in sequence, and then back to load lock 16. Carousel 20 is lightweight, and may be made of aluminum.

Figure 3:
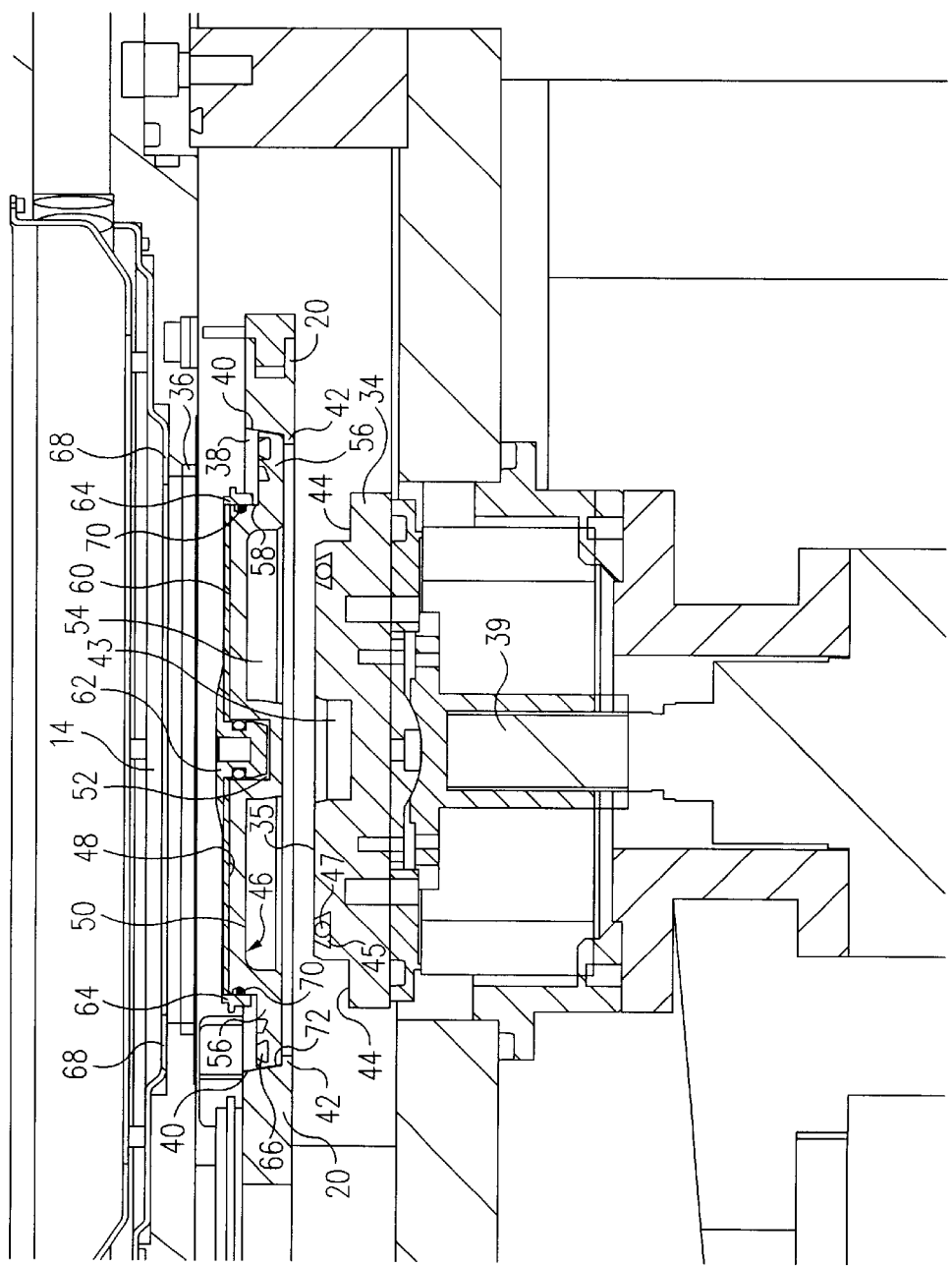
FIG. 3 is a cross-sectional side view of a carousel that is supporting a substrate transport tray beneath a sputtering chamber of the sputtering system.

FIG. 3 shows a lift pedestal 34 in a lowered position beneath a sputtering chamber 14. In this position, lift pedestal 34 is vertically below aperture 38 of carousel 20, which allows carousel 20 to rotate without interference. Similarly, the lift pedestal 34 at load lock 16 is lowered below carousel 20. Supported within aperture 38 of carousel 20 is a substrate transport tray 46, upon which a substrate 60, inner mask 62, and outer mask 64 are supported.

Each lift pedestal 34 is supported on a gimbal 39. Gimbal 39 compensates for possible misalignment between tray 46 and pedestal 34, on the one hand, and the surfaces around access apertures 36, 37. The gimballing of pedestal 34 allows even pressure to be applied to O-ring 66 and thus helps to assure a vacuum seal of apertures 36, 37.

Figure 5:
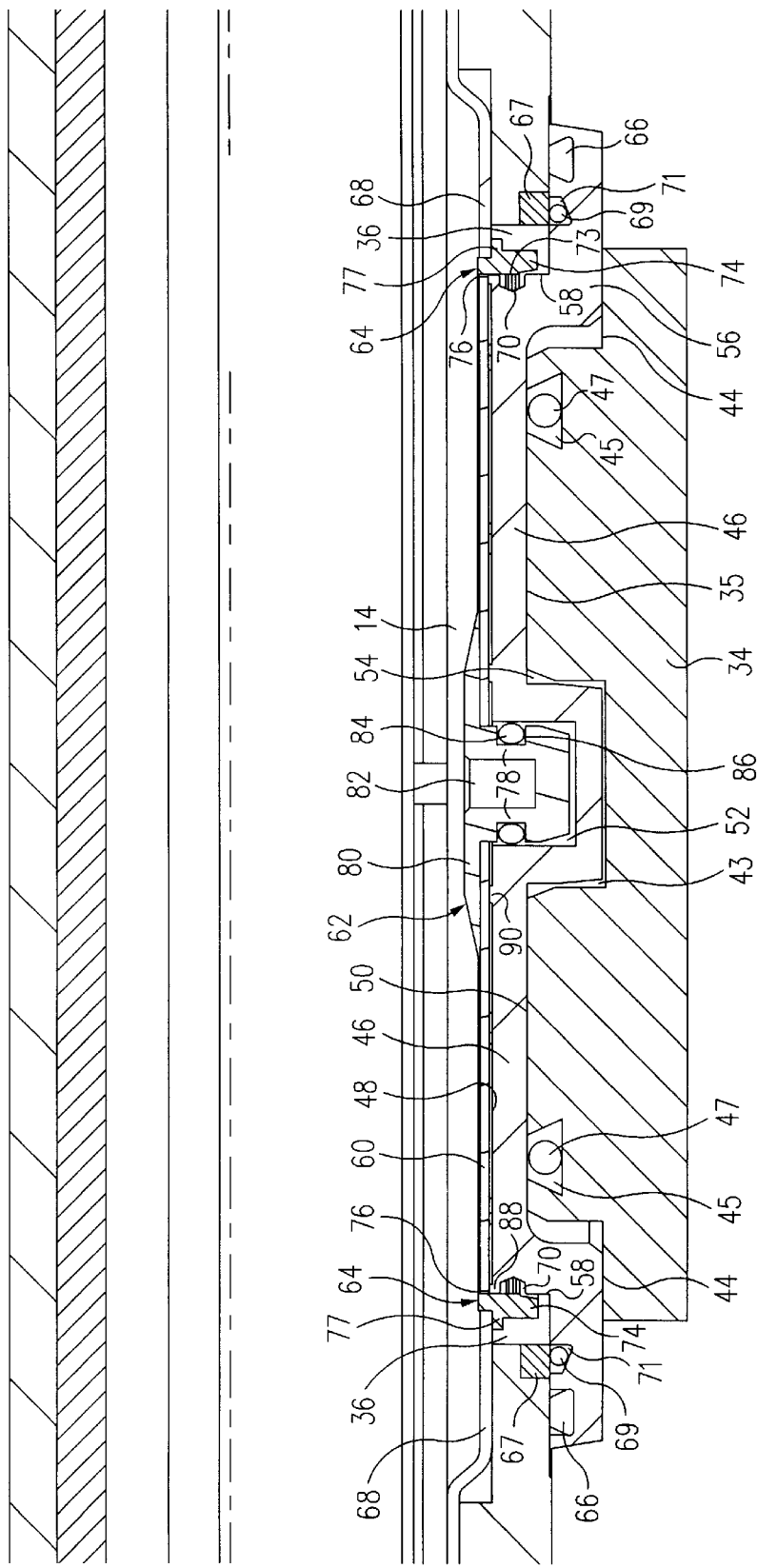
FIG. 5 is a cross-sectional side view of a substrate, inner mask, and outer mask that are supported by the substrate transport tray.

FIG. 5 is a cross sectional view of tray 46, which is cylindrical and formed of aluminum, steel, or some other metal. Tray 46 includes a first side 48 upon which a substrate 60 is horizontally mounted, an opposite second side 50, and a stepped peripheral surface consisting of a circumferential, vertically-extending portion 58 that begins at first side 48, and a horizontal, circumferential, outward-extending flange 56 that is between vertically-extending portion 58 and second side 50. Outer end 72 of flange 56 has an inward taper. Second side 50 of tray 46 has an annular aperture 54 that is adapted to engage lift pedestal 34.

Substrate 60 of FIG. 5 rests horizontally on a plurality of flat-topped projections that extend from first side 48 of tray 46. In FIG. 5, two such projections extend from first side 48 of tray 46. The first projection 88 contacts the underside of substrate 60 proximate to the outer periphery of substrate 60, and the second projection 90 contacts the underside of substrate 60 closer to the central aperture of substrate 60. In particular, inner projection 90 is located beneath annular head 80 of inner mask 62. In one embodiment, projections 88, 90 are in the form of annular rings on first side 48, although discrete projections also may be used. An advantage of having a plurality of spaced-apart projections 88, 90 to support substrate 60 is that substrate 60 may be easily lifted off of tray 46 by end effector 28 (FIG. 1) without creating a significant back force.

Figure 4:
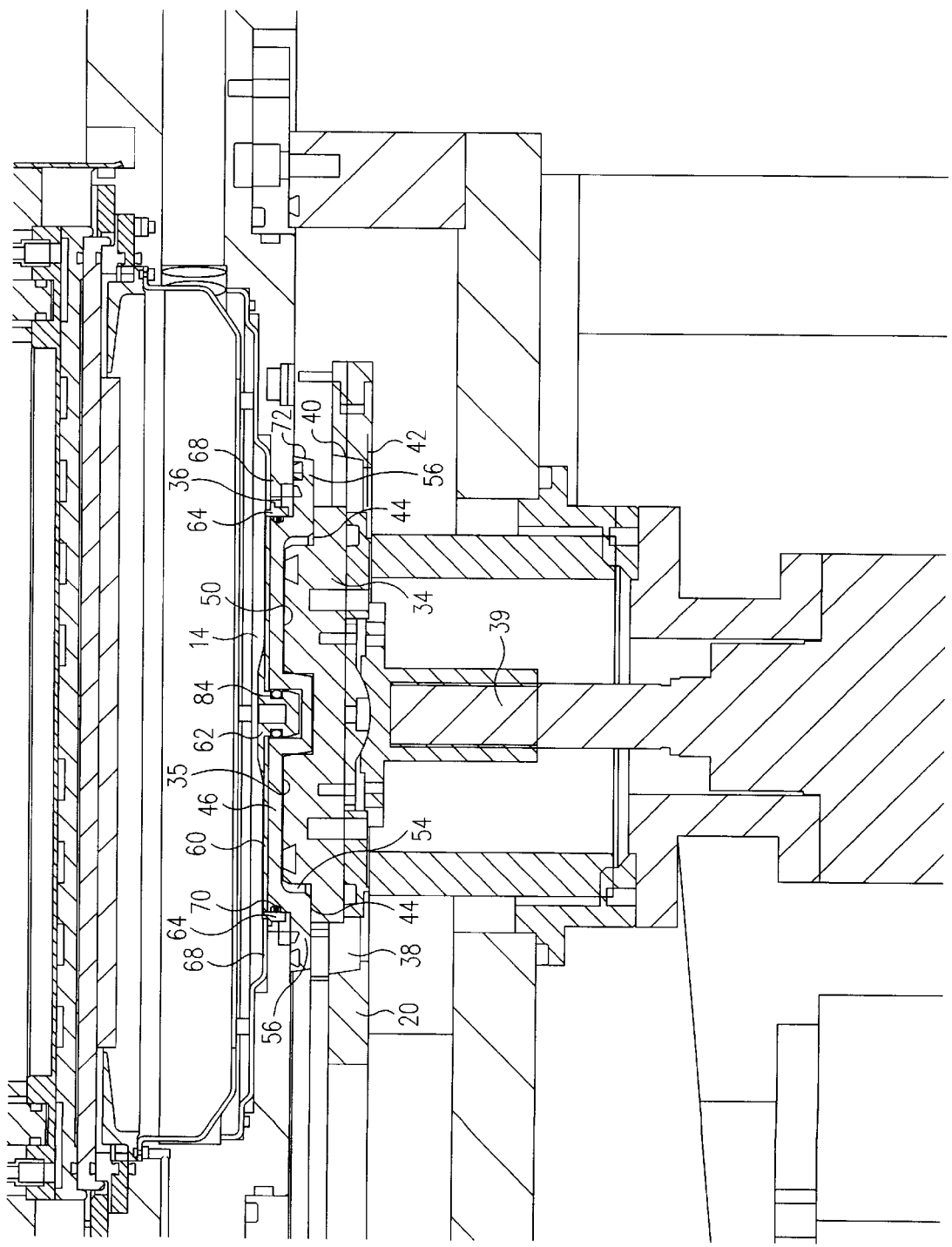
FIG. 4 is a cross-sectional side view of the substrate transport tray of FIG. 4 after the tray is positioned by a lift pedestal over a lower access aperture of the sputtering chamber.

First side 60 of tray 46 includes a cylindrical central bore 52 within which inner mask 62 is supported. Inner mask 62 of FIGS. 3-5 is formed of aluminum, steel, or some other metal and includes a vertically-extending body 78 with an annular head 80 at an upper end of body 78. Body 78 is within the central aperture of substrate 60, and annular head 80 superimposes the upper surface of substrate 60 so as to mask a round central portion of substrate 60 during sputtering. A groove 86 is formed around the outer surface of body 78 below head 80. A helical spring 84 resides in groove 86 and projects outwardly from body 78.

During the loading of an unprocessed substrate 60 onto end effector 28 at the external substrate change station, substrate 60 is forced over spring 84 of inner mask 62. Spring 84 subsequently springs back and captures substrate 60 beneath head 80. When, as discussed above, inner mask 62 is pressed into bore 52 of tray 46 by end effector 28 (FIG. 1) at load lock 16, spring 84 exerts a uniform outward pressure on the vertical edges of bore 52, which support and center inner mask 62 in bore 52. End effector 28 grips inner mask 62 within central aperture 82 of body 78 where no direct sputtering takes place. Although inner mask 62 is supported above the horizontal bottom of bore 52 in the embodiment of FIG. 5, inner mask 62 may rest on the bottom of bore 52 in an alternative embodiment.

Figure 6:
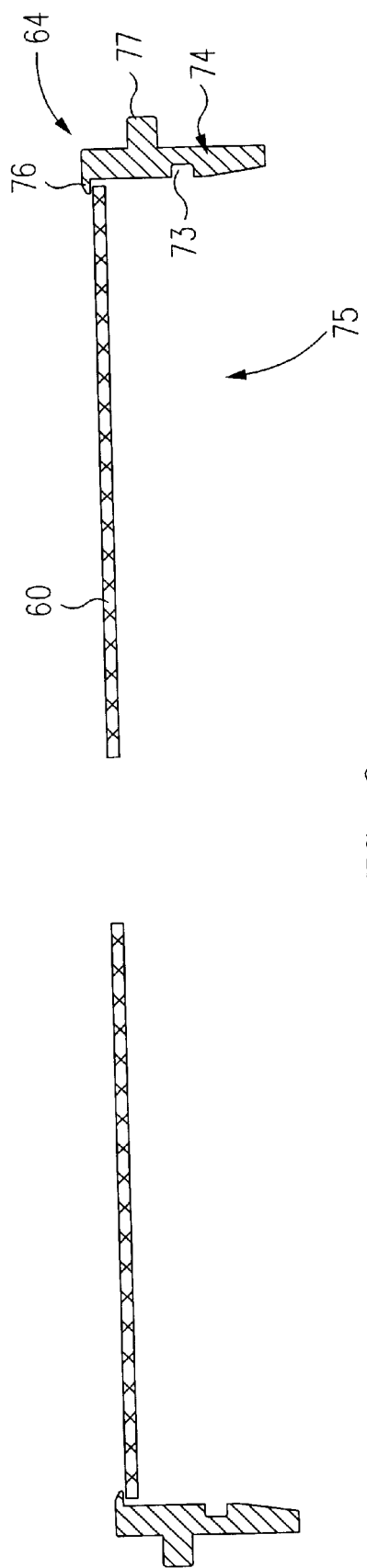
FIG. 6 is a cross-sectional side view of an outer mask.

Referring to FIG. 6, outer mask 64 has a hollow body 74. Body 74 has a central aperture 75 bounded by a vertically-extending sidewall. A lip 76 at an upper end of body 74 extends inwardly so as to superimpose a narrow circumferential portion of substrate 60. Outer mask 64 is sized so that substrate 60 may be horizontally disposed within aperture 75. A flange 77 extends outwardly from the outer surface of body 74. Outer mask 64 is gripped by end effector 28 on the outer surface of body 74 beneath flange 77 where direct sputtering does not occur. Outer mask 64 may be formed of aluminum, steel, or some other metal.

Referring back to FIGS. 3–5, outer mask 64 is supported above the upper surface of flange 56 and adjacent to vertically-extending portion 58 of tray 46. Tray 46 employs an outwardly extending member to support and center outer mask 64 on tray 46. In particular, a steel helical spring 70 sits in a groove around the vertically-extending portion 58 of tray 46. Spring 70 exerts a uniform outwardly-directed force on the inner sidewall of body 74, which supports outer mask 60 and centers outer mask 60 with respect to tray 46. Spring 70 contacts inner mask 60 within a groove 73 (FIG. 6) in the inner sidewall of body 74.

When, as discussed above, end effector 28 presses inner mask 62 and outer mask 64 onto tray 46 at load lock 16, spring 70 compresses slightly, and then recoils into groove 73, which locks outer mask 64 to tray 46. In an alternative embodiment, the lower end of body 74 of outer mask 64 may rest on flange 56.

The various metal to metal contacts between tray 46 and inner mask 60 (e.g., through spring 84), and between tray 46 and outer mask 64 (e.g., through spring 70) provide thermally conductive paths for cooling the masks.

FIG. 3 is a cross-sectional side view of a substrate transport tray 46 that is supported in a round aperture 38 of carousel 20. The circumferential edge of aperture 38 includes an upper portion 40 that is tapered in an inward direction, and a shoulder 42 that extends horizontally inward beneath upper portion 40. The lower surface of flange 56 rests securely on shoulder 42. The taper of upper portion 40 matches the taper of end 72 of flange 56 of tray 46. The diameter of tray 46 at end 72 of flange 56 is slightly less than the diameter of upper portion 40 of aperture 38 of carousel 20. The matching configuration of end 72 of flange 56 and the edge of aperture 38 automatically centers tray 46 in aperture 38 as lift pedestal 34 passes through aperture 38 and below carousel 20, and allows tray 46 to be easily lifted from carousel 20 by lift pedestal 34 during its upward motion. In addition, the matching configuration keeps tray 46 from moving within or slipping out of aperture 38, which allows carousel 20 to rotate with a relatively high acceleration and velocity.

As mentioned above, second side 50 of tray 46 includes an annular aperture 54, that is laterally between flange 56 and inner bore 52. Referring to FIG. 3, upper side 35 of pedestal 34 includes a cylindrical central aperture 43, an annular groove 45 with a spring 47 therein, and a circumferential shoulder 44. When pedestal 34 is moved laterally upward (FIGS. 1 and 4), spring 47 on upper side 35 of pedestal 34 contacts second side 50 of tray 46 within annular aperture 54 so that aperture 43 of pedestal 34 surrounds central bore 52 of tray 46, and shoulder 44 of pedestal 34 contacts and supports the lower side of flange 56. Accordingly, tray 46 is securely captured and supported by pedestal 34 as pedestal 34 moves upward through aperture 38 of carousel 20.

The interlocking engagement between annular aperture 54 of second side 50 of tray 46 and upper side 35 of pedestal 34 centers tray 46 (as well as the substrate 60 and masks 62 and 64 on tray 46) on pedestal 34, and thereby aligns tray 46 with access aperture 36 of sputter chamber 14 or access aperture 37 of load lock 16. As pedestal 34 reaches the top of its stroke, pedestal 34 presses tray 46 against the portions of sputter system 10 surrounding access apertures 36, 37. A gasket on flange 56 (i.e., O-ring 66) makes contact with surfaces of system 10 around access apertures 36, 37, and thereby forms a vacuum seal that isolates the respective sputter chamber 14 or load lock 16 from main vacuum chamber 12 of sputter system 10. Accordingly, a different pressure and different process conditions can be established in each of the sputter chambers 14 and in load lock 16. This facilitates the sputtering of different materials in the various sputter chambers 14, and allows load lock 16 to cycle between vacuum and atmospheric conditions while the sputter chambers 14 and main vacuum chamber 12 are at vacuum conditions.

FIG. 4 shows flange 56 of tray 46 pressed against the portion of sputtering system 10 that surrounds the access aperture 36 of a sputtering chamber 14, thereby forming a vacuum seal. A plasma sputtering process may then be initiated. A shield 68 extends horizontally over flange 77 of outer mask 64. The overlap of shield 68 and flange 77 prevents stray sputtered material from depositing on the outer surface of outer mask 64 where end effector 28 (FIG. 1) grips outer mask 64. A spring 69 in a groove 71 on flange 56 of tray 46 contacts a hardened, stainless steel insert 67 at the edge of aperture 36 (and aperture 37), which provides a metal to metal contact between tray 46 and the surfaces around aperture 36.

After the sputtering process in a particular sputter chamber 14 is complete, pedestal 34 is lowered through aperture 38 of carousel 20. The lower surface of flange 56 of tray 46 comes to rest on shoulder 42 of carousel 20. Once pedestal 34 is fully below carousel 20, as shown in FIG. 3, carousel 20 may be rotated.

Artisans will appreciate that numerous changes could be made to the exemplary apparatus and methods described above, without departing from the scope of the following claims.

What is claimed is:

1. A tray for supporting a substrate in a sputtering system, said tray comprising:
   a body having a first side upon which the substrate is to be horizontally disposed during sputtering, an opposite second side, a circumferential vertically-extending portion beginning at the first side of the tray, and a circumferential flange extending outwardly between the vertically extending portion and the second side, wherein the first side includes a central bore wherein an inner mask is supported during sputtering.

2. The tray of claim 1, wherein the first side of the tray includes at least two
   projections upon which the substrate is to be mounted during sputtering.

3. The tray of claim 2, wherein a first of said at least two projections is located so as to contact the substrate proximate to a peripheral edge of the substrate, and a second of said at least two projections located so as to contact the substrate between the first projection and a central aperture of the substrate.

4. The tray of claim 3, wherein the first and second projections are annular rings.

5. The tray of claim 1, wherein the sputtering system includes at least one sputtering chamber having an access aperture and a load lock having an access aperture, and the tray is adapted to selectively seal the access apertures when positioned over the respective aperture.

6. The tray of claim 5, wherein the flange includes a gasket thereon, said gasket being adapted to form a seal around the respective access aperture.

7. The tray of claim 1, wherein a hollow outer mask is to be transported by the tray in the sputtering system, said outer mask having a central aperture bounded by a vertically-extending sidewall, and the vertically-extending portion of the tray is adapted to fit within the vertical sidewall of the outer mask.

8. The tray of claim 7, wherein the vertically-extending portion of the tray is adapted to engage an inner surface of the sidewall of the outer mask.

9. The tray of claim 8, further comprising a member that extends outwardly from the vertically-extending portion of the tray, said member adapted to engage said inner surface of the sidewall of the outer mask.

10. The tray of claim 9, wherein the member is a spring around the vertically-extending portion of the tray, said spring being adapted to engage the inner surface of the outer mask and apply a uniform circumferential force on the inner surface of the outer mask, thereby making the outer mask concentric with the tray.

11. The tray of claim 1, wherein the second side of the tray includes an annular aperture around said bore, said annular aperture adapted so as to engage a lift pedestal of the sputter system.

12. The tray of claim 1, wherein the sputtering system includes a rotary table, and the flange is adapted to engage the rotary table within an aperture thereof.

13. An assembly for use with a substrate in a sputtering system, said substrate having a central aperture, the assembly comprising:
   an inner mask having vertically-extending portion within the central aperture of the substrate;
   an outer mask around the substrate; and
   a substrate transport tray having a first side upon which the substrate is horizontally mounted, wherein the tray supports both the inner mask and the outer mask during sputtering.

14. The assembly of claim 13, wherein the first side of the tray includes a central bore, and the vertically-extending portion of the inner mask is supported within the central bore.

15. The assembly of claim 14, wherein the central bore of the tray is bounded by a sidewall, and the vertically-extending portion of the inner mask is engaged with said sidewall.

16. The assembly of claim 15, wherein the vertically-extending portion of the inner mask includes a spring that contacts the sidewall of the central bore of tray.

17. The assembly of claim 14, wherein the first side of the tray includes at least two projections upon which the substrate is mounted.

18. The assembly of claim 17, wherein a first of said at least two projections contacts the substrate proximate to a peripheral edge of the substrate, and a second of said at least two projections contacts the substrate between the first projection and the central aperture of the substrate.

19. The assembly of claim 18, wherein the first and second projections are annular rings.

20. The assembly of claim 13, wherein the outer mask has a central aperture bounded by a vertically-extending sidewall, and a vertically-extending portion of the tray is within the central aperture of the outer mask.

21. The assembly of claim 20, wherein the vertically-extending portion of the tray is engaged with an inner surface of the sidewall of the outer mask.

22. The assembly of claim 21, further comprising a member that extends outwardly from the vertically-extending portion of the tray and engages the inner surface of the sidewall of the outer mask.

23. The assembly of claim 22, wherein the member is a spring around the vertically-extending portion of the tray, said spring applying a uniform circumferential force on the inner surface of the outer mask, thereby making the outer mask concentric with the tray.

24. The assembly of claim 13, wherein the sputtering system includes at least one sputtering chamber having an access aperture and a load lock having an access aperture, and the tray is adapted to seal the respective access apertures when positioned over the respective aperture.

25. The assembly of claim 24, wherein the tray further comprises a circumferential flange extending outwardly between the vertically extending portion and the second side, said flange being adapted to cover a portion of the sputtering system around the respective aperture to form the seal.

26. The assembly of claim 13, wherein the tray includes a second side opposite the first side of the tray, and the second side of the tray includes an annular aperture adapted to engage a lift pedestal of the sputtering system.

27. A sputtering system for coating a substrate having a central aperture, said sputtering system comprising:
   a plurality of sputtering chambers integral with a main vacuum chamber;
   a load lock integral with the main vacuum chamber, wherein the sputtering chambers and the load lock include an access aperture between the respective sputtering chamber or load lock and the main vacuum chamber;
   a plurality of substrate transfer trays each having a first side upon which the substrate is to be horizontally mounted, wherein each tray supports both an inner mask and an outer mask during sputtering, and is adapted to seal the respective access apertures when positioned over the respective aperture;
   a carousel having a plurality of apertures, each aperture adapted to support one of said trays when the carousel moves between the sputtering chambers and the load lock; and
   a plurality of lift pedestals, wherein one of said lift pedestals is positioned beneath the respective access aperture of the sputtering chambers and the load lock, and each pedestal moves a tray between the carousel and the respective access aperture and holds the tray over the access aperture.

28. The sputtering system of claim 27, wherein the inner mask is generally mushroom shaped, and first side of the transfer trays have a central bore wherein the inner mask is supported.

29. The sputtering system of claim 27, wherein the outer mask has a hollow body with a central aperture bounded by a vertically-extending sidewall, and a portion of the respective tray is within the central aperture of the outer mask.

30. The sputtering system of claim 27, wherein a circumferential edge of each of the apertures of the carousel includes a tapered portion and a shoulder; and
each tray has a circumferential flange that is adapted to rest on the shoulder, said flange having a tapered end that matches the tapered portion of the edge of the aperture.

31. The sputtering system of claim 27, wherein at least some of the lift pedestals include a gimbal.

32. The sputtering system of claim 27, wherein the lift pedestal vertically moves the tray between the respective aperture of the carousel and the access aperture of the respective sputtering chamber or load lock.

33. The sputtering system of claim 27, wherein the sputtering system is a horizontal sputtering system.

34. A method of disposing a substrate in a sputtering system, said substrate having a central first aperture, the method comprising:
providing an inner mask;
providing an outer mask;
providing a substrate transport tray in the sputtering system, said tray having a first side;
supporting the substrate horizontally on the first side of the tray; and
supporting the inner mask and the outer mask on the tray, wherein a vertically extending portion of the inner mask is within the first aperture of the substrate, the inner mask superimposes a central portion of a first surface of the substrate, and the outer mask superimposes a circumferential portion of the first surface of the substrate.

35. The method of claim 34, wherein the first side of the tray has a central bore, and the vertically extending portion of the inner mask is supported within said central bore.

36. The method of claim 34, wherein the substrate is supported on a least two projections of the first side of the tray, wherein a first of said projections contacts the substrate proximate to a peripheral edge of the substrate and a second of said projections contacts the substrate between the first projection and the central first aperture of the substrate.

37. The method of claim 34, further comprising-centering the outer mask so as to be concentric with the tray, and centering the inner mask and the substrate so as to be concentric with the outer mask.

38. The method of claim 34, wherein the outer mask has a central aperture bounded by a vertically-extending sidewall, and a portion of the tray is within the central aperture of the outer mask.

39. The method of claim 38, wherein the outer mask is supported by a engagement between the tray and an inner surface of the sidewall of the outer mask.

40. The method of claim 34, wherein the sputtering system includes at least one sputtering chamber having an access aperture and a load lock having an access aperture, and further comprising:
selectively sealing one of the respective access apertures of the sputtering chamber or load lock with the tray while positioning the substrate, the inner mask and the outer mask within the respective sputtering chamber or load lock.

41. The method of claim 34, wherein the sputtering system includes vacuum chamber having a rotary table therein, and further comprising:
supporting the tray within an aperture of said table; and
transporting the tray and the inner mask, the outer mask, and the substrate thereon between a load lock and a sputtering station of the sputtering system by rotating said table.

42. The method of claim 34, further comprising:
sputter coating the first surface of the substrate.

43. The method of claim 34, further comprising:
moving the substrate, the inner mask, and the outer mask to the sputtering system from an external position; and
placing the substrate, the inner mask, and the outer mask on the tray, said tray being located within a load lock of the sputtering system prior to said placing.

44. The method of claim 43, further comprising sputter coating the first surface of the substrate.

45. The method of claim 43, further comprising transporting the substrate, the inner mask, the outer mask and the tray from the load lock into a sputtering chamber of the sputtering system, sealing the sputtering chamber with the tray, and sputter coating the first surface of the substrate in the sputtering chamber.

46. The method of claim 45, wherein the sputtering system is a horizontal sputtering system.

47. The method of claim 34, wherein the sputtering system is a horizontal sputtering system.

48. The method of claim 47, further comprising sputter coating the first surface of the substrate.

49. A method of sputter coating a substrate in a sputtering system, the method comprising:
providing a sputtering system including a loadlock, a sputtering chamber, and a main vacuum chamber between the loadlock and the sputtering chamber;
loading a substrate and a first mask through a first access aperture of the loadlock and onto a transportable tray in the loadlock, wherein the transportable tray seals a second access aperture of the loadlock between the loadlock and the main vacuum chamber;
transferring the transportable tray with the substrate and the first mask thereon to the sputtering chamber through the main vacuum chamber while maintaining a vacuum state in the main vacuum chamber; and
sputter coating the substrate in the sputtering chamber, wherein the first mask masks a portion of the substrate and the transportable tray seals the sputtering chamber from the main vacuum chamber.

50. The method of claim 49, wherein the first mask comprises an inner mask that masks an inner portion of the substrate or an outer mask that masks a peripheral portion of the substrate, said first mask being supported on the transportable tray during said transferring and sputtering steps.

51. The method of claim 49, wherein maintaining the vacuum state in the main vacuum chamber during said transferring step comprises sealing a second said transportable tray against the second access aperture of the loadlock.

52. The method of claim 51, further comprising loading a second said substrate and a second said first mask onto the second said transportable tray during the sealing of the second access aperture by the second said transportable tray.

* * * * *